United States Patent
Lee et al.

(10) Patent No.: US 12,398,342 B2
(45) Date of Patent: Aug. 26, 2025

(54) PROCESS LIQUID COMPOSITION FOR LITHOGRAPHY AND PATTERN FORMING METHOD USING SAME

(71) Applicant: YOUNG CHANG CHEMICAL CO., LTD, Gyeongsangbuk-do (KR)

(72) Inventors: Su Jin Lee, Daegu (KR); Gi Hong Kim, Daegu (KR); Seung Hun Lee, Daegu (KR); Seung Hyun Lee, Daegu (KR)

(73) Assignee: YOUNG CHANG CHEMICAL CO., LTD, Gyeongsangbuk-do (KR)

( * ) Notice: Subject to any disclaimer, the term of this patent is extended or adjusted under 35 U.S.C. 154(b) by 772 days.

(21) Appl. No.: 17/626,357

(22) PCT Filed: Jun. 24, 2020

(86) PCT No.: PCT/KR2020/008141
§ 371 (c)(1),
(2) Date: Jan. 11, 2022

(87) PCT Pub. No.: WO2021/010609
PCT Pub. Date: Jan. 21, 2021

(65) Prior Publication Data
US 2022/0251472 A1    Aug. 11, 2022

(30) Foreign Application Priority Data

Jul. 18, 2019  (KR) .................. 10-2019-0086818

(51) Int. Cl.
| | | |
|---|---|---|
| *C11D 1/00* | (2006.01) | |
| *C11D 1/04* | (2006.01) | |
| *C11D 1/12* | (2006.01) | |
| *C11D 1/14* | (2006.01) | |
| *C11D 1/34* | (2006.01) | |
| *C11D 3/24* | (2006.01) | |
| *C11D 3/30* | (2006.01) | |
| *G03F 7/00* | (2006.01) | |
| *G03F 7/20* | (2006.01) | |
| *G03F 7/32* | (2006.01) | |

(52) U.S. Cl.
CPC ............. *C11D 1/004* (2013.01); *C11D 1/04* (2013.01); *C11D 1/12* (2013.01); *C11D 1/146* (2013.01); *C11D 1/345* (2013.01); *C11D 3/245* (2013.01); *C11D 3/30* (2013.01); *G03F 7/2004* (2013.01); *G03F 7/322* (2013.01); *G03F 7/70925* (2013.01); *C11D 2111/22* (2024.01)

(58) Field of Classification Search
CPC ........... C11D 1/146; C11D 1/12; C11D 1/345; C11D 3/245; C11D 3/30
USPC ........................................ 510/175, 176, 504
See application file for complete search history.

(56) References Cited

U.S. PATENT DOCUMENTS

| | | | |
|---|---|---|---|
| 2003/0152874 A1* | 8/2003 | Nakahara ................ | G03F 7/425 430/323 |
| 2004/0029395 A1 | 2/2004 | Zhang et al. | |
| 2004/0248752 A1* | 12/2004 | Jung ........................ | G03F 7/32 257/E21.026 |
| 2012/0108485 A1* | 5/2012 | Kamimura ............. | C11D 3/046 510/176 |
| 2013/0053291 A1* | 2/2013 | Otake ................ | H01L 21/02074 510/175 |
| 2013/0161284 A1 | 6/2013 | Matsunaga et al. | |
| 2013/0330927 A1* | 12/2013 | Kumagai ............... | C11D 7/263 510/176 |
| 2016/0376533 A1 | 12/2016 | Lamanna et al. | |
| 2019/0390139 A1* | 12/2019 | Tamboli ............... | C11D 3/2082 |

FOREIGN PATENT DOCUMENTS

| | | | | |
|---|---|---|---|---|
| CN | 102929109 A | 2/2013 | | |
| EP | 2479616 A1 | 7/2012 | | |
| JP | 2009181145 A | 8/2009 | | |
| JP | 2009229572 A | 10/2009 | | |
| JP | 2009271548 A | 11/2009 | | |
| JP | 2016-504482 A | 2/2016 | | |
| KR | 10-2008-0009970 A | 1/2008 | | |
| KR | 10-2009-0017129 A | 2/2009 | | |
| KR | 10-2013-0123164 A | 11/2013 | | |
| KR | 10-2018-0126555 A | 11/2018 | | |
| WO | WO-0210858 A2 * | 2/2002 | ........... | G03F 7/0035 |
| WO | WO-2005043245 A2 * | 5/2005 | ............. | C09K 13/02 |
| WO | WO-2016042408 A2 * | 3/2016 | ....... | H01L 21/02063 |
| WO | WO-2021060672 A1 * | 4/2021 | ............. | C11D 1/002 |
| WO | WO-2021131449 A1 * | 7/2021 | ............... | C11D 1/37 |

* cited by examiner

*Primary Examiner* — Gregory R Delcotto
(74) *Attorney, Agent, or Firm* — NKL Law; Jae Youn Kim

(57) ABSTRACT

Proposed is a process liquid composition for improving a lifting defect level of a photoresist pattern containing a surfactant and for reducing the number of defects of the photoresist pattern, the composition containing a surfactant and having a surface tension of 40 mN/m or less and a contact angle of 60° or smaller in the photoresist pattern having hydrophobicity represented by a contact angle of 70° or greater of water with respect to a photoresist surface in a photoresist pattern process.

5 Claims, No Drawings

PROCESS LIQUID COMPOSITION FOR LITHOGRAPHY AND PATTERN FORMING METHOD USING SAME

TECHNICAL FIELD

The present invention relates to a process liquid composition for alleviating a lifting defect level of a photoresist pattern and for reducing the number of defects of the photoresist pattern, the photoresist pattern having hydrophobicity represented by a contact angle of 70° or greater of water with respect to a photoresist surface in a photoresist pattern process, and to a method of forming a photoresist pattern using the process liquid composition.

BACKGROUND ART

Generally, a semiconductor is manufactured by a lithographic process in which exposure light is infrared light in a wavelength of 193 nm, 248 nm, 365 nm, or the like. There is intense competition among semiconductor manufacturers for reduction in a critical dimension (hereinafter referred to as a CD).

Accordingly, the finer pattern is to be formed, the narrower wavelength a light source needs to produce. At the present time, a lithographic technology using an extreme ultraviolet (EUV in a wavelength of 13.5 nm) is actively employed. A narrower wavelength may be realized using this lithographic technology.

However, the resistance of EUV photoresist to etching is not yet improved, and thus a photoresist pattern having a high aspect ratio still needs to be used. Accordingly, a pattern lifting defect occurs easily during development, and the number of defects is increased. Consequently, a process margin is greatly reduced in a manufacturing process.

To solve this problem, there is a demand to develop the technology for alleviating a level of a lifting defect that occurs while forming a fine pattern and for reducing the number of defects. The best way to alleviate a pattern lifting defect level and reduce the number of defects may be to improve photoresist performance. However, there is a need to consider a situation where, in practice, it is difficult to develop new photoresist having performance that is satisfactory in terms of all aspects.

There is still a need to develop new photoresist. However, attempts have been made to alleviate the pattern lifting defect level and reduce the number of defects in ways other than addressing this need.

DISCLOSURE

Technical Problem

An objective of the present invention is to develop a process liquid composition for alleviating a level of a pattern lifting defect and reducing the number of defects, the pattern lifting defect occurring after developing photoresist having hydrophobicity represented by a contact angle of 70° or greater of water with respect to a photoresist surface, and to develop a method of forming a photoresist pattern using the process liquid composition.

Technical Solution

Various surfactants are used to manufacture a water-based process liquid composition that is used during a developing process. However, according to the present invention, an effective process liquid composition was manufactured using a fluorine-based surfactant and a hydrocarbon-based anionic surfactant.

The use of a hydrocarbon-based non-ionic surfactant with a property like hydrophobicity in manufacturing the water-based process liquid composition in which ultra-pure water is mostly contained may lead to forming a hydrophobic sidewall of a photoresist and thus reducing pattern melting or collapse. However, in this case, the hydrocarbon-based non-ionic surfactants have a strong tendency to agglomerate, resulting in preventing a property of the process liquid composition from being uniform. Theretofore, there is a likelihood that the agglomerating hydrocarbon-based non-ionic surfactants will cause a defect while the process liquid composition is in use. That is, the use of the hydrocarbon-based non-ionic surfactant requires an increase in the usage amount thereof for reducing the pattern melting. Thus, there is a concern that photoresist will be damaged. In addition, the excessive use of an unsuitable surfactant for the purpose of reducing surface tension of the process liquid composition to reduce a capillary force may lead to the pattern melting and rather may further cause the pattern collapse.

In addition, in the case of a hydrocarbon-based cationic surfactant, an active group dissociates into a cation in an aqueous solution, and it is rarely ensured that metal is formed. Thus, there is a concern that a serious defect will be caused to occur in a lithographic process.

According to the present invention, it was verified that the use of the fluorine-based surfactant and the hydrocarbon-based anionic surfactant achieved the noticeable effect of alleviating the pattern lifting defect level and reducing the number of defects. The surface tension and the contact angle, which were much more decreased than in the hydrocarbon-based non-ionic surfactant, increased penetrability and spreadability, leading to contribution to formation of a fine pattern. It was recognized that this contribution resulted in the noticeable effect.

Tetramethylammonium hydroxide is diluted with pure water to a predetermined concentration (2.38% by weight of tetramethylammonium hydroxide is mixed with 97.62% by weight of water for use in most of the photolithographic developing processes) for use as a representative developing solution that is currently used in most of the photolithographic developing processes.

It was verified that a pattern lifting defect was caused in a case where, in a photolithographic process, a photoresist pattern having hydrophobicity represented by a contact angle of 70° or greater of water with respect to a photoresist surface was successively cleaned only with pure water after being developed. Furthermore, it was verified that, in the photolithographic process, the pattern collapse was also caused in a case where a process liquid composition resulting from tetramethylammonium hydroxide being contained in pure water was successively applied after developing or in a case where pure water was successively applied.

It could be estimated that the pattern collapse was caused because the process liquid composition containing tetramethylammonium hydroxide weakened the exposed fine pattern and because the capillary force was great and was non-uniform.

Therefore, in order to prevent the exposed-pattern collapse and to reduce the line width roughness (LWR) and the number of defects additionally required in a process, there is a need to conduct a study on an alkali substance that exerts a relatively weaker force on the exposed pattern than tetramethylammonium hydroxide.

According to the present invention, it was verified that, in a case where tetraethylammonium hydroxide, tetrapropylammonium hydroxide, and tetrabutylammonium hydroxide was used among alkali substances, not only was the pattern collapse prevented and the LWR, but the number of defects was also reduced.

According to a desirable first embodiment of the present invention, there is provided a process liquid composition for alleviating a level of a lifting defect of a photoresist pattern and for reducing the number of lifting defects of the photoresist pattern, the composition containing a surfactant and having a surface tension of 40 millinewton/meter (mN/m=1/1000 newton/meter) or less and a contact angle of 60° or smaller in the photoresist pattern having hydrophobicity represented by a contact angle of 70° or greater of water with respect to a photoresist surface in a photoresist pattern process.

According to a more desirable second embodiment of the present invention, there is provided a process liquid composition for alleviating a level of a lifting defect of a photoresist pattern and for reducing the number of lifting defects of the photoresist pattern, the lifting defect occurring during photoresist developing, the process liquid composition containing: 0.00001 to 0.1% by weight of a fluorine-based surfactant; 0.0001 to 0.1% by weight of a hydrocarbon-based anionic surfactant; 0.0001 to 0.1% by weight of an alkali substance; and 99.7 to 99.99979% by weight of water.

According to the most desirable third embodiment of the prevent invention, there is a process liquid composition for alleviating a level of a lifting defect of a photoresist pattern and for reducing the number of lifting defects of the photoresist pattern, the lifting defect occurring during photoresist developing, the process liquid composition containing: 0.00001 to 0.1% by weight of a fluorine-based surfactant; 0.001 to 0.1% by weight of a hydrocarbon-based anionic surfactant; 0.001 to 0.1% by weight of an alkali substance; and 99.7 to 99.9979% by weight of water, the composition having a surface tension of 40 mN/m or less and a contact angle of 60° or smaller.

In the process liquid composition according to any one of the first to third embodiments, the fluorine-based surfactant may be selected from the group consisting of fluoroacryl carboxylate, fluoroalkyl ether, fluoroalkylene ether, fluoroalkyl sulfate, fluoroalkyl phosphate, fluoroacryl co-polymer, fluoro co-polymer, perfluorinated acid, perfluorinated carboxylate, perfluorianted sulfonate, and mixtures thereof.

In the process liquid composition according to any one of the second to third embodiments, wherein the hydrocarbon-based anionic surfactant may be selected from the group consisting of ammonium salt of polycarboxylic acid, sulfonate salt, sulfate ester salt, phosphoric acid ester salt, and mixtures thereof.

In the process liquid composition according to any one of the first to third embodiments, wherein the alkali substance may be selected from the group consisting of tetraethylammonium hydroxide, tetrapropylammonium hydroxide, tetrabutylammonium hydroxide, and mixtures thereof.

According to an aspect of the present invention, there is provided a method of forming a photoresist pattern, the method including: (a) a step of dispensing photoresist on a semiconductor substrate and forming a photoresist film; (b) a step of exposing the photoresist film to light, developing the photoresist film, and forming a photoresist pattern; and (c) a step of cleaning the photoresist pattern with the process liquid composition.

It was thought that the pattern collapse was caused by the capillary force occurring between patterns when the patterns were cleaned with pure water after developing. However, it was experimentally recognized that only the reduction of the capillary force could neither completely prevent the pattern collapse nor reduce the number of the lifting defects.

The excessive use of the unsuitable surfactant for the purpose of reducing the surface tension of the process liquid composition to reduce the capillary force may lead to the pattern melting and rather may further cause the pattern collapse or increase the number of lifting defects.

In order to alleviate the level of the pattern lifting defect and reduce the number of the pattern lifting defects, it is important to select a surfactant that reduces the surface tension of the process liquid composition and at the same time prevents the melting of the photoresist pattern.

The process liquid composition according to the present invention exerts an enhancing effect on the photoresist and particularly achieves the effect of alleviating the level of the pattern lifting defect and the number of the pattern lifting defects, the pattern lifting defect occurring while developing photoresist having hydrophobicity represented by a contact angle of 70° or greater of water with respect to a photoresist surface.

Advantageous Effects

The process liquid composition according to the present invention achieves the effect of alleviating the level of the pattern lifting defect and the number of the pattern lifting defects, the effect that cannot be achieved only with photoresist when a pattern is formed using the photoresist having hydrophobicity represented by a contact angle of 70° or greater of water with respect to a photoresist surface. The photoresist forming method including the step of cleaning the photoresist pattern with the process liquid composition can achieve the effect of greatly reducing manufacturing cost.

BEST MODE

The present invention will be described in more detail below.

The present invention, which is the result of conducting much research over a long period of time, relates to a "process liquid composition for alleviating a lifting defect level of a photoresist pattern and reducing the number of defects of the photoresist, the process liquid composition containing: 0.00001 to 0.1% by weight of a fluorine-based surfactant selected from the group consisting of fluoroacryl carboxylate, fluoroalkyl ether, fluoroalkylene ether, fluoroalkyl sulfate, fluoroalkyl phosphate, fluoroacryl co-polymer), fluoro co-polymer, perfluorinated acid, perfluorinated carboxylate, perfluorianted sulfonate, and mixtures thereof; 0.0001 to 0.1% by weight of an anionic surfactant selected from the group consisting of ammonium salt of polycarboxylic acid, sulfonate salt, sulfate ester salt, phosphoric acid ester salt, and mixtures thereof; 0.0001 to 0.1% by weight of an alkali substance selected from the group consisting of tetraethylammonium hydroxide, tetrapropylammonium hydroxide, tetrabutylammonium hydroxide, and mixtures thereof; and 99.7 to 99.99979% by weight of water". Composition components of the process liquid composition according to the present invention and a composition ratio between the components thereof were specified as shown in Embodiments 1 to 60. Composition components and a composition ratio that were in contrast with the abovementioned composition components and composition ratio, respectively, were specified as shown in Comparative Examples 1 to 12.

Desired embodiments of the present invention and comparative examples for comparison therewith will be described below. However, the desired embodiments described below of the present invention are only exemplary, and the present invention is not limited thereto.

MODE FOR INVENTION

Embodiment 1

A process liquid composition for alleviating a collapse level of a photoresist pattern, which contains 0.001% by weight of fluoroacryl carboxylate, 0.01% by weight of ammonium salt of polycarboxylic acid, and 0.005% by weight of tetrabutylammonium hydroxide, was manufactured using the following method.

0.001% by weight of fluoroacryl carboxylate, 0.01% by weight of ammonium salt of polycarboxylic acid, and 0.005% by weight of tetrabutylammonium hydroxide were added into a remaining amount of distilled water and stirred for 5 hours. Then, the resulting liquid was caused to pass through a filter with a size of 0.01 μm to remove fine-sized soluble-solid impurities. In this manner, the process liquid composition for alleviating the collapse level of the photoresist pattern was manufactured.

Embodiments 2 to 60

Process liquid compositions for alleviating a defect level of a photoresist pattern that was the same as a defect level of a photoresist pattern in Embodiment 1 were manufactured according to composition components and component ratios therebetween that were specified as shown in Tables 1 to 12.

Comparative Example 1

Usually, distilled water that was to be used as a cleaning solution in the last process among semiconductor manufacturing processes was prepared.

Comparative Examples 2 to 12

For comparison with embodiments, process liquid compositions were manufactured, as in Embodiment 1, according to the composition components and the component ratios therebetween that were specified as shown in Tables 1 to 12.

Experimental Examples 1 to 60 and Comparative Experimental Examples 1 to 12

Measurements of pattern lifting defect levels and number-of-defects reduction ratios were performed on silicon wafers, patterns on which were formed in Embodiments 1 to 60 and Comparative Examples 1 to 12. The measurements are described as Experimental Examples 1 to 60 and Comparative Experimental Examples 1 to 12. The results of the measurements are shown in Table 13.

(1) Verification of Pattern Lifting Prevention

After exposure energy and focus were split, among a total of 89 blocks, the number of blocks in which a pattern did not collapse was measured using a critical dimension-scanning electron microscope (CD-SEM, manufactured by Hitachi, Ltd).

(2) Number-of-Lifting-Defects Reduction Ratio

Counting of the number A of defects was performed on a photoresist pattern that was rinsed with each process liquid composition sample, using surface defect observation equipment (manufactured by KLA-Tencor Corporation). A value of 100 was assigned to the number B of defects that resulted when the photoresist pattern was rinsed only with pure water. Then, the number A of defects was expressed as a ratio to the number B of defects, that is, as (A/B)×100.

The number of defects that resulted when rinsing was performed only with pure water was defined as 100. The degree to which the number of defects was decreased (improved) or increased (degraded) when compared with the number of defects resulting from rinsing only with pure water was expressed as a reduction ratio.

(3) Transparency

Transparency of the manufactured process liquid composition was checked with the naked eye and was marked as a transparent or opaque process liquid composition.

(4) Surface Tension and Contact Angle

A surface tension and a contact angle of each of the process liquid compositions were measured using a surface tension measuring instrument [the K100 Force Tensiometer manufactured by KRÜSS GmbH] and a contact angle measuring instrument [the DSA-100 Drop Shape Analyzer manufactured by KRÜSS GmbH].

TABLE 1

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodiment 1 | Fluoroacryl carboxylate | 0.001 | Ammonium salt of polycarboxylic acid | 0.01 | Tetrabutylammonium hydroxide | 0.005 | Distilled water | 99.9840 |
| Embodiment 2 | Fluoroalkyl ether | 0.001 | Ammonium salt of polycarboxylic acid | 0.01 | Tetrabutylammonium hydroxide | 0.005 | Distilled water | 99.9840 |
| Embodiment 3 | Fluoroalkylene ether | 0.001 | Ammonium salt of polycarboxylic acid | 0.01 | Tetrabutylammonium hydroxide | 0.005 | Distilled water | 99.9840 |
| Embodiment 4 | Fluoroalkyl sulfate | 0.001 | Ammonium salt of polycarboxylic acid | 0.01 | Tetrabutylammonium hydroxide | 0.005 | Distilled water | 99.9840 |
| Embodiment 5 | Fluoroalkyl phosphate | 0.001 | Ammonium salt of polycarboxylic acid | 0.01 | Tetrabutylammonium hydroxide | 0.005 | Distilled water | 99.9840 |
| Embodiment 6 | Fluoroacryl co-polymer | 0.001 | Ammonium salt of polycarboxylic acid | 0.01 | Tetrabutylammonium hydroxide | 0.005 | Distilled water | 99.9840 |
| Embodiment 7 | Fluoro co-polymer | 0.001 | Ammonium salt of polycarboxylic acid | 0.01 | Tetrabutylammonium hydroxide | 0.005 | Distilled water | 99.9840 |
| Embodiment 8 | Perfluorinated acid | 0.001 | Ammonium salt of polycarboxylic acid | 0.01 | Tetrabutylammonium hydroxide | 0.005 | Distilled water | 99.9840 |

TABLE 1-continued

|  | Surfactant | | Surfactant | | Alkali substance | | Distilled water | |
|---|---|---|---|---|---|---|---|---|
|  | Name | Content (% by weight) | Name | Content (% by weight) | Name | Content (% by weight) | Name | Content (% by weight) |
| Embodiment 9 | Perfluorinated carboxylate | 0.001 | Ammonium salt of polycarboxylic acid | 0.01 | Tetrabutylammonium hydroxide | 0.005 | Distilled water | 99.9840 |
| Embodiment 10 | Perfluorianted sulfonate | 0.001 | Ammonium salt of polycarboxylic acid | 0.01 | Tetrabutylammonium hydroxide | 0.005 | Distilled water | 99.9840 |
| Comparative Example 1 | — | — | — | — | — | — | Distilled water | 100 |
| Comparative Example 2 | — | — | — | — | Tetrabutylammonium hydroxide | 0.005 | Distilled water | 99.9950 |

TABLE 2

|  | Surfactant | | Surfactant | | Alkali substance | | Distilled water | |
|---|---|---|---|---|---|---|---|---|
|  | Name | Content (% by weight) | Name | Content (% by weight) | Name | Content (% by weight) | Name | Content (% by weight) |
| Embodiment 11 | Fluoroacryl carboxylate | 0.001 | Sulfonate salt | 0.01 | Tetrabutylammonium hydroxide | 0.005 | Distilled water | 99.9840 |
| Embodiment 12 | Fluoroalkyl ether | 0.001 | Sulfonate salt | 0.01 | Tetrabutylammonium hydroxide | 0.005 | Distilled water | 99.9840 |
| Embodiment 13 | Fluoroalkylene ether | 0.001 | Sulfonate salt | 0.01 | Tetrabutylammonium hydroxide | 0.005 | Distilled water | 99.9840 |
| Embodiment 14 | Fluoroalkyl sulfate | 0.001 | Sulfonate salt | 0.01 | Tetrabutylammonium hydroxide | 0.005 | Distilled water | 99.9840 |
| Embodiment 15 | Fluoroalkyl phosphate | 0.001 | Sulfonate salt | 0.01 | Tetrabutylammonium hydroxide | 0.005 | Distilled water | 99.9840 |
| Embodiment 16 | Fluoroacryl co-polymer | 0.001 | Sulfonate salt | 0.01 | Tetrabutylammonium hydroxide | 0.005 | Distilled water | 99.9840 |
| Embodiment 17 | Fluoro co-polymer | 0.001 | Sulfonate salt | 0.01 | Tetrabutylammonium hydroxide | 0.005 | Distilled water | 99.9840 |
| Embodiment 18 | Perfluorinated acid | 0.001 | Sulfonate salt | 0.01 | Tetrabutylammonium hydroxide | 0.005 | Distilled water | 99.9840 |
| Embodiment 19 | Perfluorinated carboxylate | 0.001 | Sulfonate salt | 0.01 | Tetrabutylammonium hydroxide | 0.005 | Distilled water | 99.9840 |
| Embodiment 20 | Perfluorianted sulfonate | 0.001 | Sulfonate salt | 0.01 | Tetrabutylammonium hydroxide | 0.005 | Distilled water | 99.9840 |

TABLE 3

|  | Surfactant | | Surfactant | | Alkali substance | | Distilled water | |
|---|---|---|---|---|---|---|---|---|
|  | Name | Content (% by weight) | Name | Content (% by weight) | Name | Content (% by weight) | Name | Content (% by weight) |
| Embodiment 21 | Fluoroacryl carboxylate | 0.00001 | Ammonium salt of polycarboxylic acid | 0.01 | Tetrabutylammonium hydroxide | 0.005 | Distilled water | 99.98499 |
| Embodiment 22 | Fluoroacryl carboxylate | 0.0001 | Ammonium salt of polycarboxylic acid | 0.01 | Tetrabutylammonium hydroxide | 0.005 | Distilled water | 99.9849 |
| Embodiment 1 | Fluoroacryl carboxylate | 0.001 | Ammonium salt of polycarboxylic acid | 0.01 | Tetrabutylammonium hydroxide | 0.005 | Distilled water | 99.9840 |
| Embodiment 23 | Fluoroacryl carboxylate | 0.01 | Ammonium salt of polycarboxylic acid | 0.01 | Tetrabutylammonium hydroxide | 0.005 | Distilled water | 99.9750 |
| Embodiment 24 | Fluoroacryl carboxylate | 0.1 | Ammonium salt of polycarboxylic acid | 0.01 | Tetrabutylammonium hydroxide | 0.005 | Distilled water | 99.8850 |
| Comparative Example 3 | Fluoroacryl carboxylate | 1 | Ammonium salt of polycarboxylic acid | 0.01 | Tetrabutylammonium hydroxide | 0.005 | Distilled water | 98.9850 |

TABLE 4

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodiment 25 | Fluoroalkyl ether | 0.00001 | Ammonium salt of polycarboxylic acid | 0.01 | Tetrabutylammonium hydroxide | 0.005 | Distilled water | 99.98499 |
| Embodiment 26 | Fluoroalkyl ether | 0.0001 | Ammonium salt of polycarboxylic acid | 0.01 | Tetrabutylammonium hydroxide | 0.005 | Distilled water | 99.9849 |
| Embodiment 2 | Fluoroalkyl ether | 0.001 | Ammonium salt of polycarboxylic acid | 0.01 | Tetrabutylammonium hydroxide | 0.005 | Distilled water | 99.9840 |
| Embodiment 27 | Fluoroalkyl ether | 0.01 | Ammonium salt of polycarboxylic acid | 0.01 | Tetrabutylammonium hydroxide | 0.005 | Distilled water | 99.9750 |
| Embodiment 28 | Fluoroalkyl ether | 0.1 | Ammonium salt of polycarboxylic acid | 0.01 | Tetrabutylammonium hydroxide | 0.005 | Distilled water | 99.8850 |
| Comparative Example 4 | Fluoroalkyl ether | 1 | Ammonium salt of polycarboxylic acid | 0.01 | Tetrabutylammonium hydroxide | 0.005 | Distilled water | 98.9850 |

TABLE 5

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodiment 29 | Fluoroalkylene ether | 0.00001 | Ammonium salt of polycarboxylic acid | 0.01 | Tetrabutylammonium hydroxide | 0.005 | Distilled water | 99.98499 |
| Embodiment 30 | Fluoroalkylene ether | 0.0001 | Ammonium salt of polycarboxylic acid | 0.01 | Tetrabutylammonium hydroxide | 0.005 | Distilled water | 99.9849 |
| Embodiment 3 | Fluoroalkylene ether | 0.001 | Ammonium salt of polycarboxylic acid | 0.01 | Tetrabutylammonium hydroxide | 0.005 | Distilled water | 99.9840 |
| Embodiment 31 | Fluoroalkylene ether | 0.01 | Ammonium salt of polycarboxylic acid | 0.01 | Tetrabutylammonium hydroxide | 0.005 | Distilled water | 99.9750 |
| Embodiment 32 | Fluoroalkylene ether | 0.1 | Ammonium salt of polycarboxylic acid | 0.01 | Tetrabutylammonium hydroxide | 0.005 | Distilled water | 99.8850 |
| Comparative Example 5 | Fluoroalkylene ether | 1 | Ammonium salt of polycarboxylic acid | 0.01 | Tetrabutylammonium hydroxide | 0.005 | Distilled water | 98.9850 |

TABLE 6

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodimen 33 | Fluoroalkyl sulfate | 0.00001 | Ammonium salt of polycarboxylic acid | 0.01 | Tetrabutylammonium hydroxide | 0.005 | Distilled water | 99.98499 |
| Embodiment 34 | Fluoroalkyl sulfate | 0.0001 | Ammonium salt of polycarboxylic acid | 0.01 | Tetrabutylammonium hydroxide | 0.005 | Distilled water | 99.9849 |
| Embodiment 4 | Fluoroalkyl sulfate | 0.001 | Ammonium salt of polycarboxylic acid | 0.01 | Tetrabutylammonium hydroxide | 0.005 | Distilled water | 99.9840 |
| Embodiment 35 | Fluoroalkyl sulfate | 0.01 | Ammonium salt of polycarboxylic acid | 0.01 | Tetrabutylammonium hydroxide | 0.005 | Distilled water | 99.9750 |
| Embodiment 36 | Fluoroalkyl sulfate | 0.1 | Ammonium salt of polycarboxylic acid | 0.01 | Tetrabutylammonium hydroxide | 0.005 | Distilled water | 99.8850 |
| Comparative Example 6 | Fluoroalkyl sulfate | 1 | Ammonium salt of polycarboxylic acid | 0.01 | Tetrabutylammonium hydroxide | 0.005 | Distilled water | 98.9850 |

TABLE 7

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodiment 37 | Fluoroalkyl phosphate | 0.00001 | Ammonium salt of polycarboxylic acid | 0.01 | Tetrabutylammonium hydroxide | 0.005 | Distilled water | 99.98499 |
| Embodiment 38 | Fluoroalkyl phosphate | 0.0001 | Ammonium salt of polycarboxylic acid | 0.01 | Tetrabutylammonium hydroxide | 0.005 | Distilled water | 99.9849 |
| Embodiment 5 | Fluoroalkyl phosphate | 0.001 | Ammonium salt of polycarboxylic acid | 0.01 | Tetrabutylammonium hydroxide | 0.005 | Distilled water | 99.9840 |
| Embodiment 39 | Fluoroalkyl phosphate | 0.01 | Ammonium salt of polycarboxylic acid | 0.01 | Tetrabutylammonium hydroxide | 0.005 | Distilled water | 99.9750 |
| Embodiment 40 | Fluoroalkyl phosphate | 0.1 | Ammonium salt of polycarboxylic acid | 0.01 | Tetrabutylammonium hydroxide | 0.005 | Distilled water | 99.8850 |
| Comparative Example 7 | Fluoroalkyl phosphate | 1 | Ammonium salt of polycarboxylic acid | 0.01 | Tetrabutylammonium hydroxide | 0.005 | Distilled water | 98.9850 |

TABLE 8

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodiment 41 | Fluoroacryl co-polymer | 0.00001 | Ammonium salt of polycarboxylic acid | 0.01 | Tetrabutylammonium hydroxide | 0.005 | Distilled water | 99.98499 |
| Embodiment 42 | Fluoroacryl co-polymer | 0.0001 | Ammonium salt of polycarboxylic acid | 0.01 | Tetrabutylammonium hydroxide | 0.005 | Distilled water | 99.9849 |
| Embodiment 6 | Fluoroacryl co-polymer | 0.001 | Ammonium salt of polycarboxylic acid | 0.01 | Tetrabutylammonium hydroxide | 0.005 | Distilled water | 99.9840 |
| Embodiment 43 | Fluoroacryl co-polymer | 0.01 | Ammonium salt of polycarboxylic acid | 0.01 | Tetrabutylammonium hydroxide | 0.005 | Distilled water | 99.9750 |
| Embodiment 44 | Fluoroacryl co-polymer | 0.1 | Ammonium salt of polycarboxylic acid | 0.01 | Tetrabutylammonium hydroxide | 0.005 | Distilled water | 99.8850 |
| Comparative Example 8 | Fluoroacryl co-polymer | 1 | Ammonium salt of polycarboxylic acid | 0.01 | Tetrabutylammonium hydroxide | 0.005 | Distilled water | 98.9850 |

TABLE 9

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodiment 45 | Fluoro co-polymer | 0.00001 | Ammonium salt of polycarboxylic acid | 0.01 | Tetrabutylammonium hydroxide | 0.005 | Distilled water | 99.98499 |
| Embodiment 46 | Fluoro co-polymer | 0.0001 | Ammonium salt of polycarboxylic acid | 0.01 | Tetrabutylammonium hydroxide | 0.005 | Distilled water | 99.9849 |
| Embodiment 7 | Fluoro co-polymer | 0.001 | Ammonium salt of polycarboxylic acid | 0.01 | Tetrabutylammonium hydroxide | 0.005 | Distilled water | 99.9840 |
| Embodiment 47 | Fluoro co-polymer | 0.01 | Ammonium salt of polycarboxylic acid | 0.01 | Tetrabutylammonium hydroxide | 0.005 | Distilled water | 99.9750 |
| Embodiment 48 | Fluoro co-polymer | 0.1 | Ammonium salt of polycarboxylic acid | 0.01 | Tetrabutylammonium hydroxide | 0.005 | Distilled water | 99.8850 |
| Comparative Example 9 | Fluoro co-polymer | 1 | Ammonium salt of polycarboxylic acid | 0.01 | Tetrabutylammonium hydroxide | 0.005 | Distilled water | 98.9850 |

TABLE 10

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodiment 49 | Perfluorinated acid | 0.00001 | Ammonium salt of polycarboxylic acid | 0.01 | Tetrabutylammonium hydroxide | 0.005 | Distilled water | 99.98499 |
| Embodiment 50 | Perfluorinated acid | 0.0001 | Ammonium salt of polycarboxylic acid | 0.01 | Tetrabutylammonium hydroxide | 0.005 | Distilled water | 99.9849 |
| Embodiment 8 | Perfluorinated acid | 0.001 | Ammonium salt of polycarboxylic acid | 0.01 | Tetrabutylammonium hydroxide | 0.005 | Distilled water | 99.9840 |
| Embodiment 51 | Perfluorinated acid | 0.01 | Ammonium salt of polycarboxylic acid | 0.01 | Tetrabutylammonium hydroxide | 0.005 | Distilled water | 99.9750 |
| Embodiment 52 | Perfluorinated acid | 0.1 | Ammonium salt of polycarboxylic acid | 0.01 | Tetrabutylammonium hydroxide | 0.005 | Distilled water | 99.8850 |
| Comparative Example 10 | Perfluorinated acid | 1 | Ammonium salt of polycarboxylic acid | 0.01 | Tetrabutylammonium hydroxide | 0.005 | Distilled water | 98.9850 |

TABLE 11

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodiment 53 | Perfluorinated carboxylate | 0.00001 | Ammonium salt of polycarboxylic acid | 0.01 | Tetrabutylammonium hydroxide | 0.005 | Distilled water | 99.98499 |
| Embodiment 54 | Perfluorinated carboxylate | 0.0001 | Ammonium salt of polycarboxylic acid | 0.01 | Tetrabutylammonium hydroxide | 0.005 | Distilled water | 99.9849 |
| Embodiment 9 | Perfluorinatrf carboxylate | 0.001 | Ammonium salt of polycarboxylic acid | 0.01 | Tetrabutylammonium hydroxide | 0.005 | Distilled water | 99.9840 |
| Embodiment 55 | Perfluorinated carboxylate | 0.01 | Ammonium salt of polycarboxylic acid | 0.01 | Tetrabutylammonium hydroxide | 0.005 | Distilled water | 99.9750 |
| Embodiment 56 | Perfluorinated carboxylate | 0.1 | Ammonium salt of polycarboxylic acid | 0.01 | Tetrabutylammonium hydroxide | 0.005 | Distilled water | 99.8850 |
| Comparative Example 11 | Perfluorinated carboxylate | 1 | Ammonium salt of polycarboxylic acid | 0.01 | Tetrabutylammonium hydroxide | 0.005 | Distilled water | 98.9850 |

TABLE 12

| | Surfactant | | Surfactant | | Alkali substance | | Distilled water | |
|---|---|---|---|---|---|---|---|---|
| | Name | Content (% by weight) | Name | Content (% by weight) | Name | Content (% by weight) | Name | Content (% by weight) |
| Embodiment 57 | Perfluorianted sulfonate | 0.00001 | Ammonium salt of polycarboxylic acid | 0.01 | Tetrabutylammonium hydroxide | 0.005 | Distilled water | 99.98499 |
| Embodiment 58 | Perfluorianted sulfonate | 0.0001 | Ammonium salt of polycarboxylic acid | 0.01 | Tetrabutylammonium hydroxide | 0.005 | Distilled water | 99.9849 |
| Embodiment 10 | Perfluorianted sulfonate | 0.001 | Ammonium salt of polycarboxylic acid | 0.01 | Tetrabutylammonium hydroxide | 0.005 | Distilled water | 99.9840 |
| Embodiment 59 | Perfluorianted sulfonate | 0.01 | Ammonium salt of polycarboxylic acid | 0.01 | Tetrabutylammonium hydroxide | 0.005 | Distilled water | 99.9750 |
| Embodiment 60 | Perfluorianted sulfonate | 0.1 | Ammonium salt of polycarboxylic acid | 0.01 | Tetrabutylammonium hydroxide | 0.005 | Distilled water | 99.8850 |
| Comparative Example 12 | Perfluorianted sulfonate | 1 | Ammonium salt of polycarboxylic acid | 0.01 | Tetrabutylammonium hydroxide | 0.005 | Distilled water | 98.9850 |

Experimental Examples 1 to 60 and Comparative Experimental Examples 1 to 12

Measurements of the pattern lifting defect level, the number-of-defects reduction ratio, the transparency, the contact angle, and the surface tension were performed on the silicon wafers, the patterns on which were formed in Embodiments 1 to 60 and Comparative Examples 1 to 12. The measurements are described as Experimental Examples 1 to 60 and Comparative Experimental Examples 1 to 12. The results of the measurements are shown in Table 13.

(1) Verification of Pattern Lifting Prevention

After exposure energy and focus were split, among a total of 89 blocks, the number of blocks in which a pattern dis not collapse was measured using the critical dimension-scanning electron microscope (CD-SEM, manufactured by Hitachi, Ltd).

(2) Number of Lifting Defects

Counting of the number A of defects was performed on a photoresist pattern that was rinsed with each process liquid composition sample, using the surface defect observation equipment (manufactured by KLA-Tencor Corporation). A value of 100 was assigned to the number B of defects that resulted when the photoresist pattern was rinsed only with pure water. Then, the number A of defects was expressed as a ratio to the number B of defects, that is, as (A/B)×100.

(3) Transparency

Transparency of the manufactured process liquid composition was checked with the naked eye and was marked as a transparent or opaque process liquid composition.

(4) Contact Angle and Surface Tension

A surface tension and a contact angle of each of the process liquid compositions were measured using the contact angle measuring instrument [the DSA-100 Drop Shape Analyzer manufactured by KRÜSS GmbH] and the surface tension measuring instrument [the K100 Force Tensiometer manufactured by KRÜSS GmbH].

TABLE 13

| | The number of blocks with no lifting defects | Number-of-defects reduction ratio (%) | Transparency | Contact angle (°) | Surface tension (mN/m) |
|---|---|---|---|---|---|
| Experimental Example 1 | 80 | 25 | transparent | 49 | 22 |
| Experimental Example 2 | 78 | 30 | transparent | 55 | 25 |
| Experimental Example 3 | 78 | 35 | transparent | 52 | 22 |
| Experimental Example 4 | 77 | 35 | transparent | 57 | 23 |
| Experimental Example 5 | 77 | 40 | transparent | 56 | 23 |
| Experimental Example 6 | 75 | 55 | transparent | 57 | 26 |
| Experimental Example 7 | 72 | 62 | transparent | 58 | 30 |
| Experimental Example 8 | 73 | 60 | transparent | 52 | 29 |
| Experimental Example 9 | 76 | 55 | transparent | 54 | 27 |
| Experimental Example 10 | 75 | 48 | transparent | 53 | 25 |
| Experimental Example 11 | 77 | 30 | transparent | 50 | 22 |
| Experimental Example 12 | 78 | 38 | transparent | 55 | 28 |
| Experimental Example 13 | 78 | 42 | transparent | 53 | 24 |
| Experimental Example 14 | 77 | 44 | transparent | 58 | 27 |
| Experimental Example 15 | 76 | 58 | transparent | 56 | 26 |
| Experimental Example 16 | 76 | 64 | transparent | 58 | 30 |
| Experimental Example 17 | 71 | 74 | transparent | 59 | 33 |
| Experimental Example 18 | 72 | 59 | transparent | 53 | 32 |
| Experimental Example 19 | 74 | 61 | transparent | 54 | 29 |
| Experimental Example 20 | 74 | 52 | transparent | 54 | 28 |
| Experimental Example 21 | 64 | 44 | transparent | 60 | 39 |
| Experimental Example 22 | 70 | 38 | transparent | 55 | 29 |
| Experimental Example 23 | 77 | 28 | transparent | 42 | 19 |
| Experimental Example 24 | 76 | 30 | transparent | 36 | 15 |
| Experimental Example 25 | 58 | 50 | transparent | 59 | 40 |
| Experimental Example 26 | 65 | 36 | transparent | 57 | 33 |
| Experimental Example 27 | 75 | 32 | transparent | 52 | 22 |
| Experimental Example 28 | 74 | 33 | transparent | 49 | 19 |
| Experimental Example 29 | 60 | 55 | transparent | 59 | 37 |
| Experimental Example 30 | 68 | 42 | transparent | 56 | 28 |
| Experimental Example 31 | 75 | 38 | transparent | 49 | 19 |
| Experimental Example 32 | 73 | 39 | transparent | 45 | 16 |
| Experimental Example 33 | 61 | 52 | transparent | 60 | 36 |
| Experimental Example 34 | 67 | 44 | transparent | 58 | 30 |
| Experimental Example 35 | 74 | 37 | transparent | 54 | 21 |
| Experimental Example 36 | 73 | 38 | transparent | 50 | 17 |
| Experimental Example 37 | 60 | 60 | transparent | 59 | 37 |
| Experimental Example 38 | 65 | 49 | transparent | 57 | 31 |
| Experimental Example 39 | 73 | 42 | transparent | 54 | 20 |
| Experimental Example 40 | 73 | 44 | transparent | 52 | 17 |
| Experimental Example 41 | 59 | 77 | transparent | 60 | 38 |
| Experimental Example 42 | 67 | 65 | transparent | 58 | 32 |
| Experimental Example 43 | 71 | 58 | transparent | 55 | 23 |
| Experimental Example 44 | 70 | 60 | transparent | 53 | 20 |
| Experimental Example 45 | 52 | 80 | transparent | 60 | 40 |
| Experimental Example 46 | 60 | 69 | transparent | 60 | 34 |
| Experimental Example 47 | 68 | 64 | transparent | 56 | 27 |
| Experimental Example 48 | 66 | 65 | transparent | 55 | 24 |
| Experimental Example 49 | 61 | 82 | transparent | 57 | 38 |
| Experimental Example 50 | 69 | 73 | transparent | 55 | 35 |
| Experimental Example 51 | 72 | 62 | transparent | 50 | 24 |
| Experimental Example 52 | 71 | 65 | transparent | 48 | 20 |
| Experimental Example 53 | 63 | 68 | transparent | 58 | 39 |
| Experimental Example 54 | 70 | 62 | transparent | 56 | 33 |
| Experimental Example 55 | 74 | 55 | transparent | 51 | 23 |
| Experimental Example 56 | 73 | 56 | transparent | 50 | 22 |
| Experimental Example 57 | 61 | 57 | transparent | 60 | 38 |
| Experimental Example 58 | 68 | 50 | transparent | 55 | 29 |
| Experimental Example 59 | 72 | 49 | transparent | 50 | 20 |
| Experimental Example 60 | 71 | 50 | transparent | 48 | 18 |

TABLE 13-continued

| | The number of blocks with no lifting defects | Number-of-defects reduction ratio (%) | Transparency | Contact angle (°) | Surface tension (mN/m) |
|---|---|---|---|---|---|
| Comparative Experimental Example 1 | 46 | 100 | transparent | 89 | 70 |
| Comparative Experimental Example 2 | 40 | 95 | transparent | 58 | 67 |
| Comparative Experimental Example 3 | 58 | 150 | transparent | 35 | 14 |
| Comparative Experimental Example 4 | 54 | 172 | transparent | 50 | 19 |
| Comparative Experimental Example 5 | 52 | 184 | transparent | 44 | 16 |
| Comparative Experimental Example 6 | 51 | 186 | opaque | 47 | 16 |
| Comparative Experimental Example 7 | 50 | 180 | opaque | 49 | 16 |
| Comparative Experimental Example 8 | 51 | 210 | opaque | 53 | 20 |
| Comparative Experimental Example 9 | 50 | 235 | opaque | 54 | 22 |
| Comparative Experimental Example 10 | 50 | 170 | opaque | 46 | 38 |
| Comparative Experimental Example 11 | 52 | 168 | opaque | 49 | 21 |
| Comparative Experimental Example 12 | 51 | 174 | opaque | 47 | 18 |

From the comparison of Experimental examples 1 to 60 with Comparative Experimental examples 1 to 12, it could be seen that, when the number of blocks in which a pattern did not collapse was 50 or greater and the number-of-defects reduction ratio was 90% or less, a more improved result were obtained than in Comparative Experimental Example 1.

It could be seen that the pattern lifting defect level was much more alleviated and the number of defects was much more reduced in Experimental Examples 1 to 60 than in Comparative Experimental Examples 1 to 12. The process liquid composition that was used in Experimental Examples 1 to 60 contained: 0.00001 to 0.1% by weight of a fluorine-based surfactant selected from among fluoroacryl carboxylate, fluoroalkyl ether, fluoroalkylene ether, fluoroalkyl sulfate, fluoroalkyl phosphate, fluoroacryl co-polymer, fluoro co-polymer, perfluorinated acid, perfluorinated carboxylate, and perfluorianted sulfonate; 0.0001 to 0.1% by weight of an anionic surfactant selected from among polycarboxylate salt, sulfonate salt, sulfate ester salt, and phosphoric acid ester salt; 0.0001 to 0.1% by weight of an alkali substance selected from among tetraethylammonium hydroxide, tetrapropylammonium hydroxide, and tetrabutylammonium hydroxide; and 99.7 to 99.99979% by weight of water.

In addition, it could be seen that, desirably, effects of alleviating the pattern lifting defect level and reducing the number of defects was much more increased in the experimental examples 1 to 60 than in Comparative Experimental Examples 1 to 12. The process liquid composition that was used in Experimental Examples 1 to 60 contained: 0.0001 to 0.1% by weight of a fluorine-based surfactant selected from among fluoroacryl carboxylate, fluoroalkyl ether, fluoroalkylene ether, fluoroalkyl sulfate, fluoroalkyl phosphate, fluoroacryl co-polymer, fluoro co-polymer, perfluorinated acid, perfluorinated carboxylate, and perfluorianted sulfonate; 0.001 to 0.1% by weight of a hydrocarbon-based anionic surfactant selected from among polycarboxylate salt, sulfonate salt, sulfate ester salt, and phosphoric acid ester salt; 0.001 to 0.1% by weight of an alkali substance selected from among tetraethylammonium hydroxide, tetrapropylammonium hydroxide, and tetrabutylammonium hydroxide; and 99.7 to 99.9979% by weight of water.

In addition, it could be seen that, more desirably, effects of alleviating the pattern lifting defect level and reducing the number of defects was much more increased in the experimental examples 1 to 60 than in Comparative Experimental Examples 1 to 12. The process liquid composition that was used in Experimental Examples 1 to 60 contained: 0.001 to 0.1% by weight of a fluorine-based surfactant selected from among fluoroacryl carboxylate, fluoroalkyl ether, fluoroalkylene ether, fluoroalkyl sulfate, fluoroalkyl phosphate, fluoroacryl co-polymer, fluoro co-polymer, perfluorinated acid, perfluorinated carboxylate, and perfluorianted sulfonate; 0.01 to 0.1% by weight of a hydrocarbon-based anionic surfactant selected from among polycarboxylate salt, sulfonate salt, sulfate ester salt, and phosphoric acid ester salt; 0.01 to 0.1% by weight of an alkali substance selected from among tetraethylammonium hydroxide, tetrapropylammonium hydroxide, and tetrabutylammonium hydroxide; and 99.7 to 99.979% by weight of water.

The result of measuring the collapse level of the photoresist pattern in Embodiment 1 for evaluation, was that the number of blocks in which the pattern did not collapse was 80.

The result of measuring the collapse level of the photoresist pattern in Comparative Experimental Example 1 for evaluation, was that the number of blocks in which the pattern did not collapse was 46.

The specific aspects of the present invention are described in detail above. It would be apparent to a person of ordinary skill in the art to which the present invention pertains that this specific description is only for the desired embodiments and do not impose any limitation on the scope of the present invention. Therefore, a substantial scope and a scope equivalent thereto must be defined by the following claims.

The invention claimed is:

1. A process liquid composition for alleviating a lifting defect level of a photoresist pattern and for reducing the number of defects of the photoresist pattern, the composition containing a surfactant, and having a surface tension of 40 mN/m or less and a contact angle of 60° or smaller in the photoresist pattern having hydrophobicity represented by a contact angle of 70° or greater of water with respect to a photoresist surface in a photoresist pattern process, the composition comprising:
    0.00001 to 0.1% by weight of a fluorine-based surfactant;
    0.0001 to 0.1% by weight of a hydrocarbon-based anionic surfactant;
    0.0001 to 0.1% by weight of an alkali substance that is selected from a group consisting of tetraethylammonium hydroxide, tetrapropylammonium hydroxide, tetrabutylammonium hydroxide, and mixtures thereof; and
    a remaining percentage by weight of water.

2. The process liquid composition of claim 1, comprising:
0.0001 to 0.1% by weight of the fluorine-based surfactant;
0.001 to 0.1% by weight of the hydrocarbon-based anionic surfactant;
0.001 to 0.1% by weight of the alkali substance; and
99.7 to 99.9979% by weight of the water.

3. The process liquid composition of claim 2, wherein the fluorine-based surfactant is selected from the group consisting of fluoroacryl carboxylate, fluoroalkyl ether, fluoroalkylene ether, fluoroalkyl sulfate, fluoroalkyl phosphate, fluoroacryl co-polymer, fluoro co-polymer, perfluorinated acid, perfluorinated carboxylate, perfluorianted sulfonate, and mixtures thereof.

4. The process liquid composition of claim 2, wherein the hydrocarbon-based anionic surfactant is selected from the group consisting of ammonium salt of polycarboxylic acid, sulfonate salt, sulfate ester salt, phosphoric acid ester salt, and mixtures thereof.

5. A method of forming a photoresist pattern, the method comprising:
(a) dispensing photoresist on a semiconductor substrate and forming a photoresist film;
(b) exposing the photoresist film to light, and developing the photoresist film to form a photoresist pattern; and
(c) cleaning the photoresist pattern with the process liquid composition of claim 1.

* * * * *